United States Patent [19]

Tamori et al.

[11] 4,285,045
[45] Aug. 18, 1981

[54] DELAY CIRCUIT

[75] Inventors: Michitoshi Tamori, Tokyo; Sotokichi Shintani, Mitaka; Hideo Kobayashi, Kawasaki; Hidetaka Yanagidaira, Omiya, all of Japan

[73] Assignee: Kokusai Denshin Denwa Co., Ltd., Tokyo, Japan

[21] Appl. No.: 88,824

[22] Filed: Oct. 26, 1979

[30] Foreign Application Priority Data

Oct. 26, 1978 [JP] Japan ................................. 53-131052

[51] Int. Cl.³ .............................................. H03H 7/30
[52] U.S. Cl. ...................................... 364/724; 333/18
[58] Field of Search ................ 364/724, 825; 328/167; 333/18, 28 R

[56] References Cited

U.S. PATENT DOCUMENTS

| | | | |
|---|---|---|---|
| 3,521,041 | 7/1970 | Van Blerkom et al. | 364/724 |
| 3,757,221 | 9/1973 | Moehrmann | 333/18 X |
| 3,868,603 | 2/1975 | Guidoux | 333/18 |
| 3,928,755 | 12/1975 | Bellanger et al. | 364/724 |
| 4,196,405 | 4/1980 | Le Dily et al. | 333/18 X |

Primary Examiner—Gareth D. Shaw
Assistant Examiner—Thomas M. Heckler
Attorney, Agent, or Firm—Armstrong, Nikaido, Marmelstein & Kubovcik

[57] ABSTRACT

A smear filter and/or a de-smear filter having the characteristics that the delay time is proportional to the frequency comprising (a) a transversal filter having a plurality of delay elements connected in series with one another, the delay time (T) of each delay element being the same as the sampling interval of the input signal, the first delay element being connected to the input terminal, a plurality of potentiometers each connected to the junction points of said delay elements and the output of the last delay element providing the tap weight to each of the tap output, and an adder for providing the sum of the outputs of said potentiometers to provide an output of the present delay circuit, (b) a digital memory storing the precalculated value for each desired delay characteristics for providing the tap weights of said potentiometers, and (c) means for providing the content of said digital memory selectively to the potentiometers according to the desired delay characteristics.

1 Claim, 3 Drawing Figures

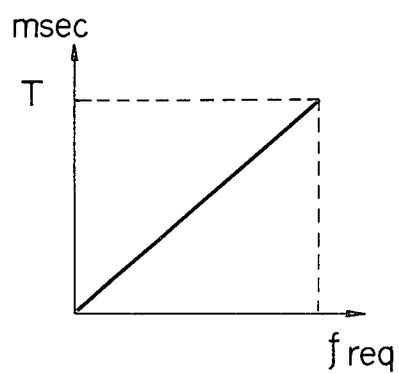
Fig.1a
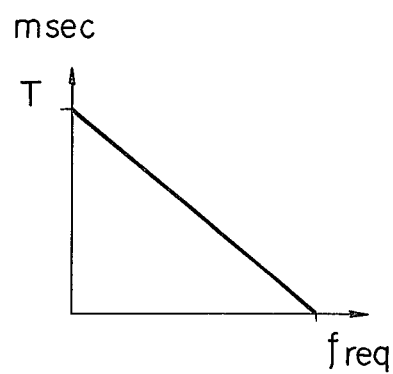
Fig.1b
Fig. 2
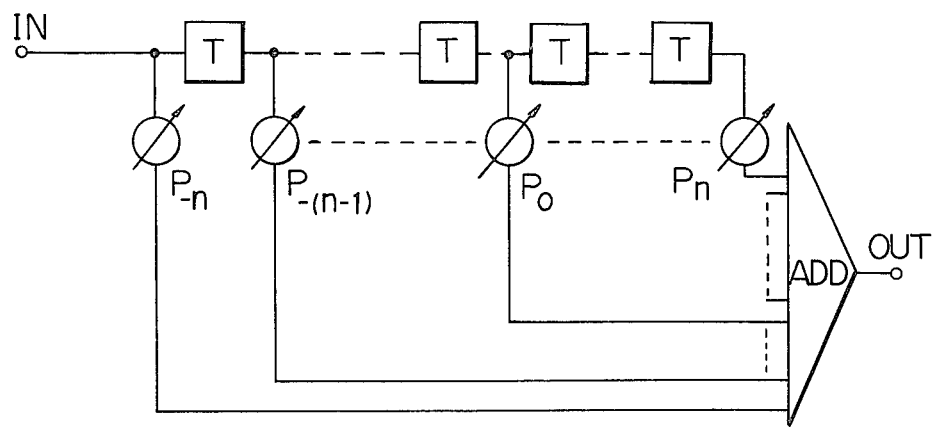

DELAY CIRCUIT

BACKGROUND OF THE INVENTION

This invention relates to a delay circuit in general, and more particularly to a smear-desmear filter capable of reducing adverse effects of the disturbances of instantaneous nature in data communication, such as short interruption.

The effectiveness of a smear-desmear filter was treated in a paper by Richard A. Wainwright published in IRE Transaction on Communication Systems, December, 1961, the contents of which will be briefly reviewed here.

When data signals with a frequency band width of 0-f Hz are applied to a circuit with a delay characteristic of FIG. 1(a) (a smear circuit), a data signal of duration t is elongated to a duration of (t+T) and then delivered to a transmission line. This elongated signal can be restored to the original data signal by passing it through another filter (desmear filter) with an inverse delay characteristic as shown in FIG. 1(b).

On the other hand, impulsive noises are generated on a transmission line, and hence, pass only through the desmear filter.

As a result, the energy of the noise power is dispersed over T seconds, and the effect of such noise power on data signals is reduced. In order to achieve any significant effects of such a smear-desmear filter, it is necessary to realize a steeply sloped linear function of delay on the frequency axis with a delay difference in a desired band width amounting to 50-100 times of the inverse of the band width. Due to difficulty in achieving such a delay difference, the smear-desmear filter has not been used on a commercial basis.

Impulsive noises generated by switches and the like, however, cannot be neglected, especially as the data density in data communication systems increases. Thus, there has been a pressing need for the development of a smear-desmear filter of superior characteristics.

SUMMARY OF THE INVENTION

Therefore, the object of the present invention is to provide a smear filter and/or a desmear filter having superior characteristics.

Basically, the present invention provides a smear-desmear filter by regulating tap weights of transversal filters so as to realize a linear function $y=a|x|$ instead of $y=ax$. The tap weights are precalculated are stored in a memory, and the contents of such memory are selectively read out and applied to the transversal filters in accordance with the desired characteristics. The tap weights for a desmear filter are equivalent to values obtained by reversing the signs of values corresponding to odd numbered tap weights, as counted from the beginning, of the smear filter corresponding to that desmear filter.

BRIEF DESCRIPTION OF THE DRAWINGS

The foregoing and other objects, features, and attendant advantages of the present invention will be appreciated as the same become better understood by means of the following description and accompanying drawings wherein;

FIG. 1(A) is a graph showing examples of the characteristics of a smear filter,

FIG. 1(B) is a graph showing examples of the characteristics of a desmear filter, FIG. 2 is a block diagram of an example of a transversal filter.

DESCRIPTION OF THE PREFERRED EMBODIMENTS

Figure 3:
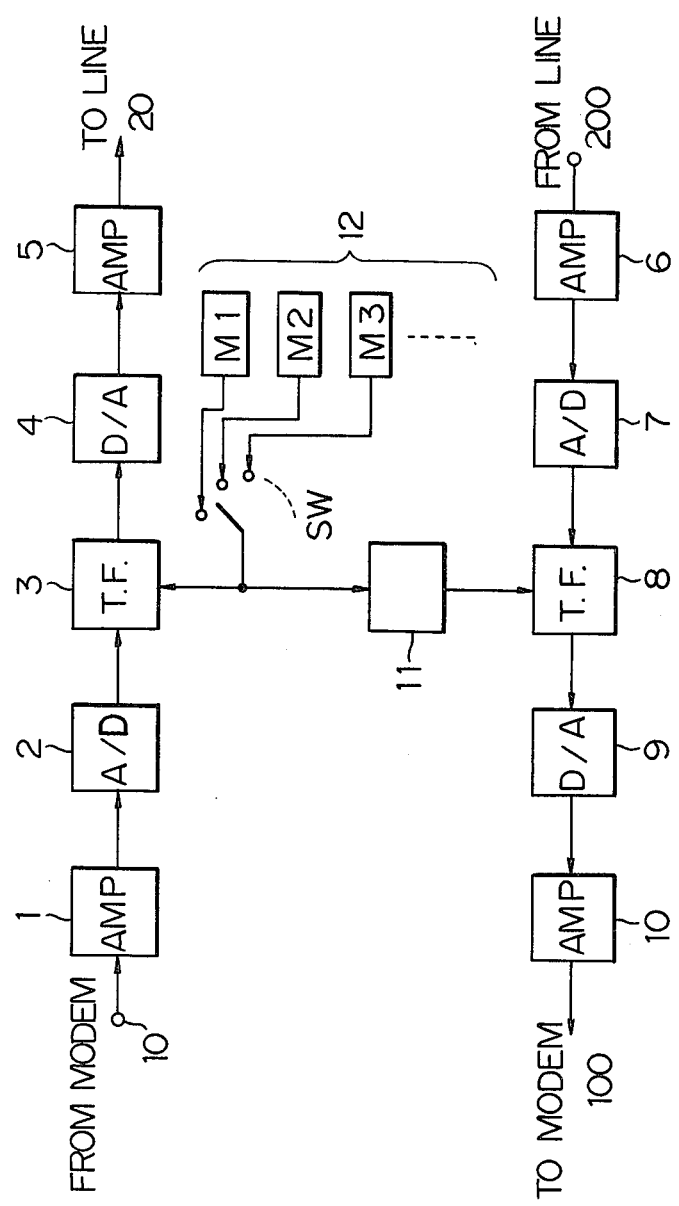
FIG. 3 is a block diagram of an embodiment of a smear-desmear filter according to the present invention.

FIG. 2 illustrates an example of transversal filter construction, wherein T is a delay element whose delay time is equal to a signal sampling interval, and $P_l$ through $P_n$ are potentiometers for giving tap weights which potentio-meters are connected to joints of the adjacent delay elements and the output side of the last delay element as shown in the Figure. ADD is an adder for summing the output from the individual potentiometers. With the illustrated arrangement, if the tap weights are properly selected, the characteristics as shown in FIG. 1(a) or 1(b) can be obtained across an input terminal IN and an output terminal OUT of the filter.

The theory of the present invention will now be described.

When a function $y=a|x|$ $(-\pi<x<\pi)$ is expanded into Fourier series, due to the properties of an even function, only cosine terms exist in the series as shown in the following equation.

$$a|x| = a\left[\frac{\pi}{2} - \frac{4}{\pi}\left(\cos x + \frac{\cos 3x}{3^2} + \ldots \right.\right. \tag{1}$$

$$\left.\left. \ldots + \frac{\cos(2k-1)x}{(2k-1)^2} + \ldots \right)\right]$$

To represent a physical system by the equation (1), it is set that $|x|=\tau|\omega|$ and the DC term $\pi/2$ is neglected on the basis that the DC term is nothing else but a delay bias, the equation can be simplified into the following expression. Here, $\tau$ has a time dimension, $\omega$ is an angular frequency, and a is a constant having a dimension of the inverse of $\omega$.

$$a\tau|\omega| = -\frac{4}{\pi}a\left(\cos(\tau|\omega|) + \frac{\cos(3\tau|\omega|)}{3^2} + \ldots \right. \tag{2}$$

$$\left. \ldots + \frac{\cos(2k-1)\tau|\omega|}{(2k-1)^2} + \ldots \right)$$

Since the equation (2) has a dimension of time an integration thereof with respect to $\omega$ converts the dimension into dimension of phase. In general, a transfer function can be expressed by a function of complex quantities $Ae^{-j\theta}$ representing an amplitude and a phase angle, so that a transfer function of the circuit of the present invention can be expressed as follows.

$$F(j\omega)=\exp\{-j\int a\tau\omega d\omega\} \tag{3}$$

Here, the range of variation of $\tau\omega$ is defined to be $0<\tau\omega<\pi$, and the constant A is set as unity, i.e., $A=1$. Then, from the equations (2) and (3), $$F(j\omega) = \exp\left\{j\frac{4a}{\pi\tau}\left(\sin \tau\omega + \frac{\sin 3\tau\omega}{3^3} + \ldots\right.\right. \tag{4}$$

-continued $$\left.\left.\ldots + \frac{\sin(2k-1)\tau\omega}{(2k-1)^3}\ldots\right)\right\}$$

The right-hand side of the equation (4) can be rewritten as follows.

$$F(j\omega) = F_1(j\omega) \cdot F_3(j\omega) \ldots F_{2k-1}(j\omega) \ldots \quad (5)$$

$$= \exp\left(j\frac{4a}{\pi\tau}\sin\tau\omega\right) \cdot \exp\left(j\frac{4a}{\pi\tau}\frac{1}{3^3}\sin 3\tau\omega\right)$$

$$\ldots \exp\left(j\frac{4a}{\tau\pi}\frac{1}{(2k-1)^3}\sin(2k-1)\tau\omega\ldots\right)$$

The terms $F_1(j\omega)$, $F_3(j\omega)$, ..., $F_{2k-1}(j\omega)$ can be rearranged in the following manner.

$$F_1(j\omega) = \sum_{l=-\infty}^{\infty} J_l(z_1)e^{jl\tau\omega}, \quad z_1 = \frac{4a}{\pi\tau} \quad (6)$$

$$F_3(j\omega) = \sum_{l=-\infty}^{\infty} J_l(z_3)e^{jl(3\tau\omega)}, \quad z_3 = \frac{4a}{\pi\tau}\cdot\frac{1}{3^3}$$

$$F_{2k-1}(j\omega) = \sum_{l=-\infty}^{\infty} J_l(z_{2k-1})e^{jl(2k-1)\tau\omega}$$

$$z_{2k-1} = \frac{4a}{\pi\tau(2k-1)^3}$$

Here, $J_1(z_{2k-1})$ is a Bessel function.

Fourier transformation of the terms $F_1(j\omega)$, $F_3(j\omega)$, ..., $F_{2k-1}(j\omega)$, ... of the equation (6) gives $$G_1(t) = \sum_{l=-\infty}^{\infty} J_l(z_1)\delta(t - l\tau) \quad (7)$$

$$G_3(t) = \sum_{l=-\infty}^{\infty} J_l(z_3)\delta(t - 3l\tau)$$

$$G_{2k-1}(t) = \sum_{l=-\infty}^{\infty} J_l(z_{2k-1})\delta\{t + (2k-1)l\tau\}$$

If a product of $F(j\omega)=F_1(j\omega)\cdot F_3(j\omega)\ldots F_{2M-1}(j\omega)$ is considered by taking the terms up to $F_{2M-1}(j\omega)$ of the equation (6), the convolution integral is applicable to the product in the time region, and the product can be simplified as follows by using the equations (7).

$$G(\pi\tau) = \sum_{l_{2M-1}=-\infty}^{\infty} \ldots \sum_{l_5=-\infty}^{\infty} \sum_{l_3=-\infty}^{\infty} [G_{2M-1}\{ \quad (8)$$
$$-(2M-1)l_{2M-1}\tau\}\ldots G_5(-3l_3\tau)G_1\{$$
$$n + (2M-1)l_{2M-1} + \ldots + 5l_5 + 3l_3\tau\}]$$

Here, quantities given by $G(n\tau)$ represent the tap weights to be used in realizing a smear filter by a transversal filter.

The tap weight for a desmear filter will now be derived.

Since $y=a|x|$ was approximated in the region of $x>0$ for the case of a smear filter, $y=-a|x|$ may be approximated in the region of $x>0$ for the case of a desmear filter corresponding to that smear filter.

Therefore, a transfer function of the desmear filter can be described as follows by comparison with the equation (4).

$$H(j\omega) = \exp\left\{-j\frac{4a}{\pi\tau}\left(\sin\tau\omega + \frac{\sin 3\tau\omega}{3^3} + \ldots \right.\right. \quad (9)$$

-continued $$\left.\left.\ldots + \frac{\sin(2k-1)\tau\omega}{(2k-1)^3} + \ldots\right)\right\}$$

Thus, the above equation (9) can be derived by reversing the signs of $z_1, z_3, \ldots, z_{2k-1}, \ldots$ of the equation (6).

In view of the relation of $$\exp\{-z_{(2k-1)}\sin(2k-1)\tau\omega\} = \quad (10)$$
$$\sum_{l=-\infty}^{\infty} (-1)^l J_l(z_{(2k-1)})e^{jl(2k-1)\tau\omega}$$

a delay characteristic with an inverted shape can be obtained by performing a multiplication of $(-1)^l$ for the time series $J_l(z_{2k-1})$ for giving the $(2k-1)$th cosine term or inverting the signs of odd-numbered terms as counted from the first term.

Based on the aforesaid fact, an approximation of the desmear filter on the frequency axis can be achieved by reversing the signs of only odd-numbered tap weights of the tap weights for the smear filter derived in the foregoing, as will be proven in the following.

More specifically, if it is true that convolution integrals of certain tap weights $G_x(l\tau)$ and $G_y(m\tau)$ provide the $G_z(n\tau)$, then $(-1)^n G_z(n\tau)$ can be obtained by performing convolution integrals on $(-1)^l G_x(l\tau)$ and $(-1)^m G_y(m\tau)$.

By repeating such operations, the finally obtained tap weights $K(n\tau)$ for the desmear tap filter become as follows in terms of the tap weights $G(n\tau)$ of the smear filter.

$$K(n\tau)=(-1)^n G(n\tau) \quad (11)$$

FIG. 3 shows an example of smear-desmear filter construction for dispersing the energy of instantaneous transmission disturbances so as to reduce adverse effects thereof. Analog signals to be transmitted are applied from a MODEM, and the output signals from the MODEM are controlled by an amplifier 1 for input level regulation and converted into digital signals by an A/D converter 2. The sampling interval in the A/D converter is assumed to be T.

The values of $G(n\tau)$ pre-determined by an electronic computer in accordance with the equation (8) are stored in a memory 12.

Since the values of $G(n\tau)$ are calculated on the basis of the delay frequency characteristics as approximated by the function of $y=a|x|$ and the values of $G(n\tau)$ varies with changes of the constant a, the memory 12 should have a sufficient capacity for storing the $G(n\tau)$ values for all required varieties of the constant a. The values stored in the memory are selected by a switch SW.

The output from the memory is used as the tap weights $G(n\tau)$ of a transversal filter 3, for changing the values of input signals to the transversal filter 3. The output from the transversal filter 3 is restored into an analog signal by a D/A converter 4, and the output level is regulated by an amplifier 5 before delivering to a line through a terminal 20.

The receiving side of the MODEM will now be described. The level of input signals applied to an input terminal 200 is regulated by an amplifier 6, and then the signals are converted into digital signals by an A/D converter 7. Another transversal filter 8 uses the output from the memory for providing tap weights therein. Here, it has been shown that the relation of $K(n\tau)=(-1)^n G(n\tau)$ is valid on the receiving side, so that the signs of the odd-numbered tap weights as counted from the first tap weight are reversed by a sign-reversing circuit 11. The sign-reversing circuit 11 for reversing the signs of the odd-numbered tap weights can be formed, for instance, by using a counter and an inverter.

The signals treated by the tap weights $(-1)^n G(n\tau)$ with the aforesaid sign reversals in the transversals filter 8 are restored into analog signals by a D/A converter 9 and the level thereof is regulated by an amplifier 10 and then delivered through an output terminal 100 (which is an input terminal as seen from the MODEM) as an output.

As described in detail in the foregoing, according to the present invention, a smear filter is realized by storing values of the quantities $G(n\tau)$ pre-calculated by an electronic computer in a memory and using such values as tap weights of a transversal filter, and also a desmear filter can be realized by passing the aforesaid tap weights $G(n\tau)$ through a simple sign-reversing circuit. With such smear filter and desmear filter, it is possible to provide a filter which can effectively suppress adverse effects of disturbances of instantaneous nature in transmission lines.

From the foregoing it will now be apparent that a new and improved delay circuit has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A delay circuit having the characteristics that the delay time is proportional to the frequency comprising:
   (a) a first analog-digital converter connected to an input terminal of the delay circuit for receiving analog signal to be transmitted by the delay circuit,
   (b) a first transversal filter connected to the output of said first analog-digital converter, said transversal filter having a plurality of delay elements connected in series with one another, the delay time (T) of each delay element being the same as the sampling interval of said first analog-digital converter, a plurality of potentiometers each having one end thereof connected to the junction points between said delay elements and the output of the last delay element, and an adder connected to the tap output of each of said potentiometers, wherein said tap outputs provide a tap weight to the output of each of said delay elements and wherein said adder sums the outputs of said potentiometers to provide an output of the transversal filter,
   (c) a first digital-analog convertor connected to the output of said transversal filter so as to provide an analog output signal to be transmitted,
   (d) a second analog-digital convertor connected to an input terminal of the delay circuit for receiving said transmitted analog signal,
   (e) a second transversal filter connected to the output of said second analog-digital converter, said transversal filter having a plurality of delay elements connected in series with one another, the delay time (T) of each delay element being the same as the sampling interval of said second analog-digital converter, a plurality of potentiometers each having one end thereof connected to the junction points between said delay elements and the output of the last delay element, and an adder connected to the tap output of each of said potentiometers, wherein said tap outputs provide a tap weight to the output of each of said delay elements and wherein said adder sums the outputs of said potentiometers to provide an output of the transversal filter,
   (f) a second digital-analog converter connected to the ouput of said second transversal filter so as to provide an analog output signal of the received signal,
   (g) a digital memory storing the precalculated value for each of the desired delay characteristics and providing the tap weights of said potentiometers of said first transversal fitler, (h) means for providing the content of said digital memory selectively to the potentiometers of said first transversal filter according to the desired delay characteristics, and
   (i) means for providing the inversed value of the content of said digital memory selectively to the potentiometers of said second transversal filter according to the desired delay characteristics.

* * * * *